United States Patent [19]

Lee et al.

[11] Patent Number: 5,884,692
[45] Date of Patent: Mar. 23, 1999

[54] COOLING DEVICE FOR CENTRAL PROCESSING UNIT MODULE

[75] Inventors: Richard Lee, Taipei; Ken Lee, Jung-Ho; Stanley Chen, Taipei, all of Taiwan

[73] Assignee: Hon Hai Precision Ind. Co., Ltd., Taipei Hsien, Taiwan

[21] Appl. No.: 94,923

[22] Filed: Jun. 15, 1998

[30] Foreign Application Priority Data

Jun. 13, 1997 [TW] Taiwan ................................. 86209672

[51] Int. Cl.⁶ ....................................................... H05K 7/20
[52] U.S. Cl. ...................... 165/80.3; 165/185; 174/16.3; 257/719; 361/704
[58] Field of Search .................................. 165/80.3, 185; 174/16.3; 257/718, 719; 361/704, 707

[56] References Cited

U.S. PATENT DOCUMENTS

| 5,526,874 | 6/1996 | White | 165/80.3 |
|---|---|---|---|
| 5,740,017 | 4/1998 | Horng | 361/704 |
| 5,784,257 | 7/1998 | Tata | 361/704 |

FOREIGN PATENT DOCUMENTS

| 292114 | 7/1991 | Germany | 257/718 |
|---|---|---|---|
| 4226816 | 2/1994 | Germany | 257/718 |
| 1198609 | 12/1985 | U.S.S.R. | 257/718 |

*Primary Examiner*—Leonard R. Leo

[57] ABSTRACT

A cooling device for a CPU consists of an attachment plate in contact with the CPU, a heat sink in contact with the attachment plate, a spring plate having two retention legs extending through the heat sink and the attachment plate, a fan mounting plate mounted with a fan and fixedly engaging with the heat sink and a mounting rod mounted between the fan mounting plate and the spring plate to compress the spring plate against the heat sink. The mounting rod is operable to move between first and second positions wherein at the first position, the mounting rod compresses the spring with a large force to cause the retention legs thereof to move away from each other and disengage with the attachment plate, and at the second position, the mounting rod compresses the spring plate with a small force to cause the retention legs thereof to move toward each other and engage with the attachment plate.

17 Claims, 3 Drawing Sheets

COOLING DEVICE FOR CENTRAL PROCESSING UNIT MODULE

BACKGROUND OF THE INVENTION

1. Field of the Invention

The present invention relates to a cooling device for a central processing unit (CPU) module, and particularly to a cooling device which can be easily assembled to a CPU module and effectively dissipate heat generated by a CPU received in the module.

2. The Prior Art

As the power consumed by a CPU increases, the cooling thereof becomes an important issue. To cool the CPU a cooling device consisting of a heat sink formed by aluminum extrusion and an electrical fan is commonly assembled to a CPU module to forcibly dissipate heat generated by the CPU.

However, assembling a conventional cooling device to the CPU module is troublesome and laborious.

Hence, an improved cooling device for a CPU module is needed to eliminate the above mentioned defects of current cooling devices.

SUMMARY OF THE INVENTION

Accordingly, an objective of the present invention is to provide a cooling device for a CPU module which can be easily assembled to the module.

Another objective of the present invention is to provide a cooling device for a CPU module which can effectively dissipate heat generated by a CPU in the module.

To fulfill the above mentioned objectives, according to a preferred embodiment of the present invention, a cooling device for a CPU module comprises an attachment plate fixed to the module, contacting with a CPU in the module and defining two elongate holes, a heat sink having a number of heat dissipating fins projecting from a base plate thereof, a spring plate having a central portion and two retention legs extending from the central portion, a mounting rod having a head end defining a slot for engaging with a screw driver, a tail end formed with a stud, a first positioning key projecting from a perimeter of the rod near the tail end, a second positioning key orthogonal to the first positioning key and projecting from the perimeter of the rod near the head end, a fan mounting plate having engaging teeth and defining a hole and a keyway in communication with the hole, and a fan fixedly mounted to the fan mounting plate.

To assemble the cooling device, the mounting rod is extended through the fan mounting plate to cause the stud thereof to rotatably engage with the central portion of the spring plate. The fan mounting plate, the mounting rod and the spring plate are then together assembled to the heat sink to reach a position where the engaging teeth of the fan mounting plate engage with the base plate of the heat sink, the second positioning key of the mounting rod is pushed by the spring plate to abut against the fan mounting plate, the spring plate is compressed between the mounting rod and the heat sink, and the retention legs of the spring plate are extended through the base plate of the heat sink and deformed in a direction away from each other. Thereafter, the attachment plate is assembled to the heat sink to contact therewith, whereby the two retention legs are extended through the two elongate holes of the attachment plate. Finally, the mounting rod is rotated to a position where the second positioning key escapes from its engagement with the fan mounting plate and the first positioning key is pushed by the spring plate to engage with the fan mounting plate, whereby the compression force acting on the spring plate is reduced and the retention legs move toward each other thereby fixedly engaging with the attachment plate. Therefore, the cooling device in accordance with the present invention is assembled.

DETAILED DESCRIPTION OF THE PREFERRED EMBODIMENT

Reference will now be made in detail to the preferred embodiment of the present invention.

Figure 1:
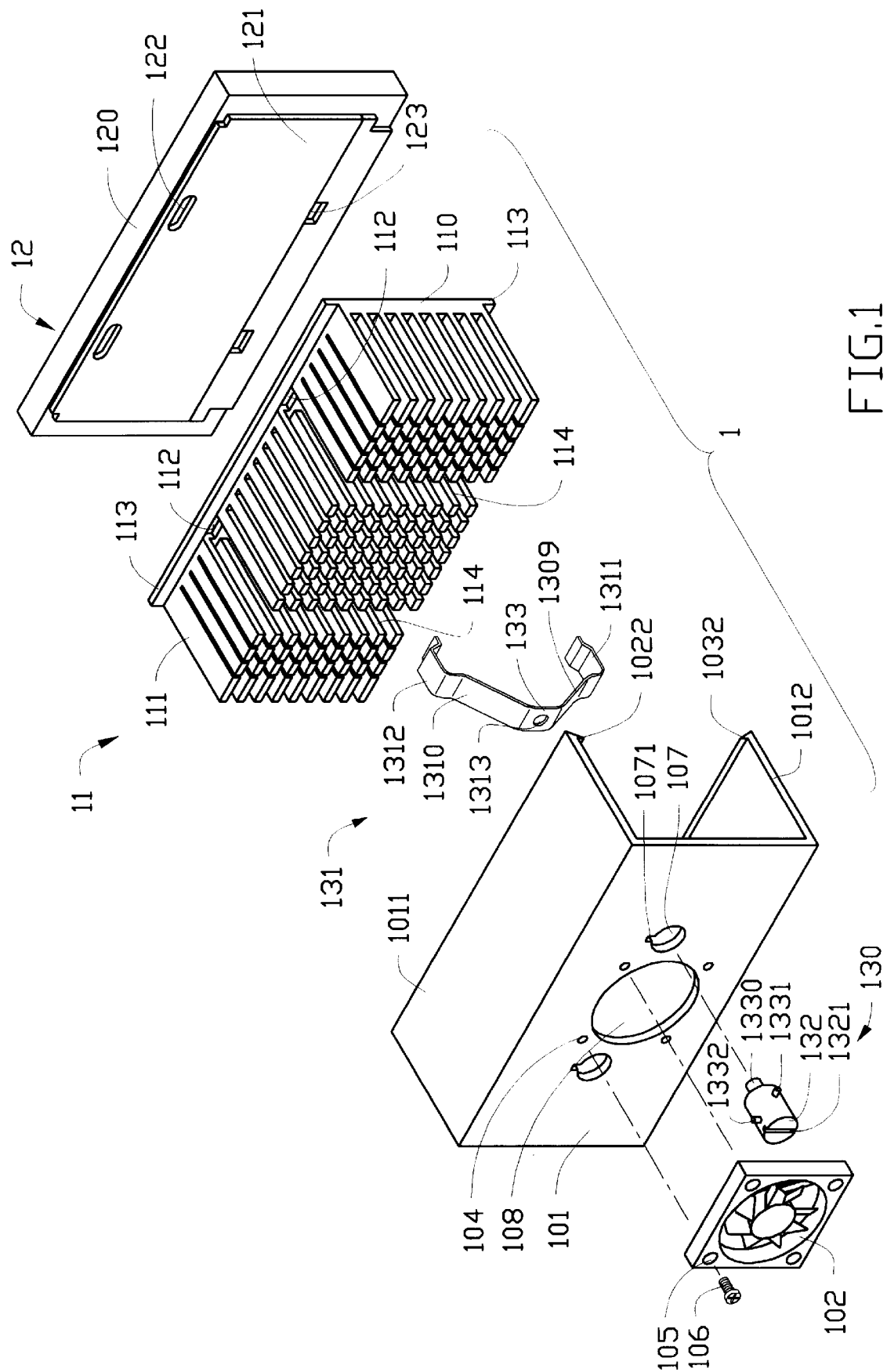
FIG. 1 is a perspective, exploded view of a cooling device in accordance with the present invention and a CPU module.

Referring to FIG. 1, a cooling device 1 includes a conventional electrical fan 102, a fan mounting plate 101, a pair of round mounting rods 130 (only one shown), a pair of spring plates 131 (only one shown), a heat sink 11 and a CPU attachment plate 121. The fan mounting plate 101, the heat sink 11 and the CPU attachment plate 121 are made of aluminum. The mounting rods 130 and the spring plates 131 are made of steel.

The fan 102 is mounted to the fan mounting plate 101 by extending a screw 106 through each hole 105 defined in the corners of the fan 102 to threadedly engage with a corresponding threaded hole 104 defined adjacent to a central hole 108 of the fan mounting plate 101, whereby the fan 102 is aligned with the central hole 108. When the fan 102 is activated, an air flow is generated to dissipate heat absorbed by the heat sink 11. Two round holes 107 are formed in the mounting plate 101 beside the four threaded holes 104. A keyway 1071 is defined at a top of each of the round holes 107 in communication therewith. The mounting plate 101 is further formed with two engaging teeth 1022, 1032 extending toward each other along a rear edge of an upper wall 1011 and a lower wall 1012 of the fan mounting plate 101, respectively.

Figure 2:
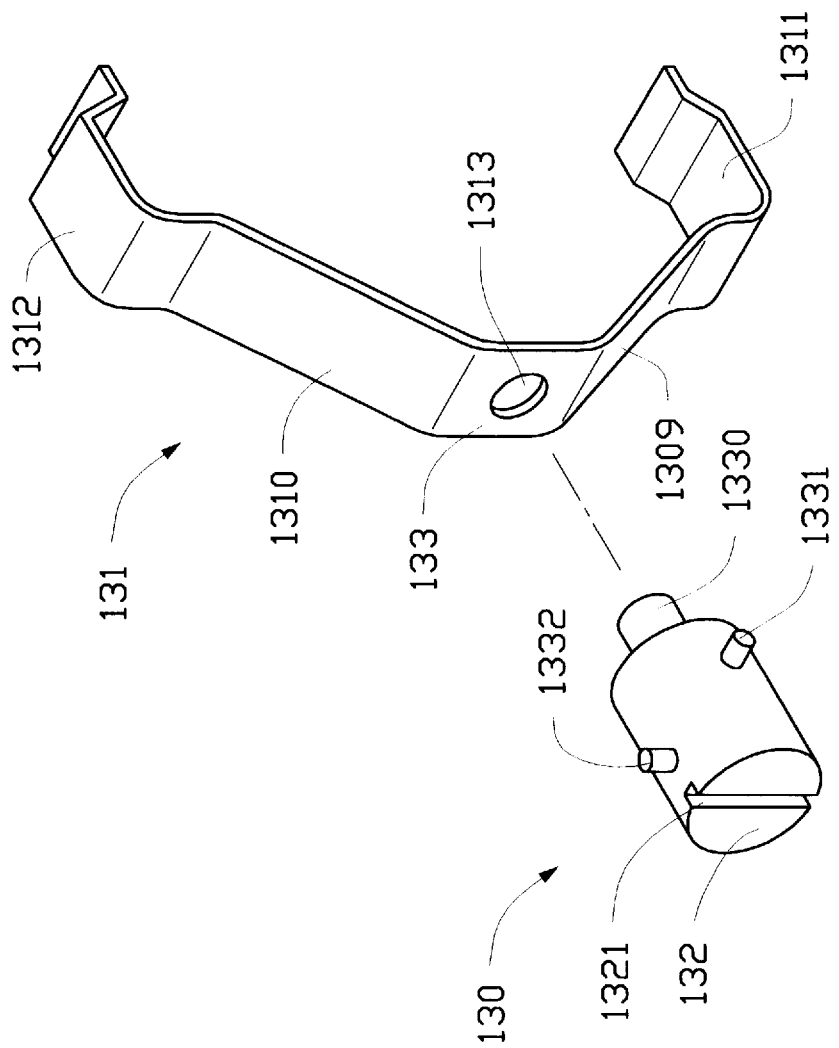
FIG. 2 is an exploded, perspective view of a mounting rod and a spring plate in accordance with the present invention.

Also referring to FIG. 2, each mounting rod 130, i.e. an actuation device, is formed with a head end 132 defining a straight slot 1321 for fittingly receiving a screw driver (not shown) so that the mounting rod 130 may be manipulated by the screw driver to rotate about an axis of the rod 130. Furthermore, a stud 1330 is formed at a tail end of the mounting rod 130. A first positioning key 1331 protrudes from a perimeter of the rod 130 near the stud 1330. A second positioning key 1332 also protrudes from the perimeter of the rod 130 but near the slot 1321. Furthermore, the first and second keys 1331, 1332 are oriented to be orthogonal to each other.

Each spring plate 131 is formed to have a rectangular body portion 133 defining a round hole 1313 having a size slightly larger than the stud 1330. Two spring arms 1309, 1310 extend rearward from opposite sides of the body portion 133, and two retention legs 1311, 1312 extend rearward from the spring arms 1309, 1310. Each retention leg 1311, 1312 forms a bent retention end (not labeled).

Returning to FIG. 1, the heat sink 11 is formed to have a number of heat dissipating fins 111 projecting from a rectangular base plate 110. A flange 113 extends from upper and lower sides of the base plate 110. The fins 111 are divided into three groups which are separated from each other by two grooves 114. The base plate 110 defines two elongate holes 112 in communication with each of the grooves 114.

The CPU attachment plate 121 is fixed to a housing 120 of a CPU module 12 receiving a CPU (not shown) therein. The CPU has a surface engaging with the CPU attachment plate 121, whereby heat generated by the CPU can be absorbed by the attachment plate 121. A pair of first and second mounting holes 122, 123 are defined in a left and right side of the attachment plate 121, respectively. The first mounting holes 122 are elongate holes with rounded ends, and the second mounting holes 123 are rectangular holes.

Figure 3:
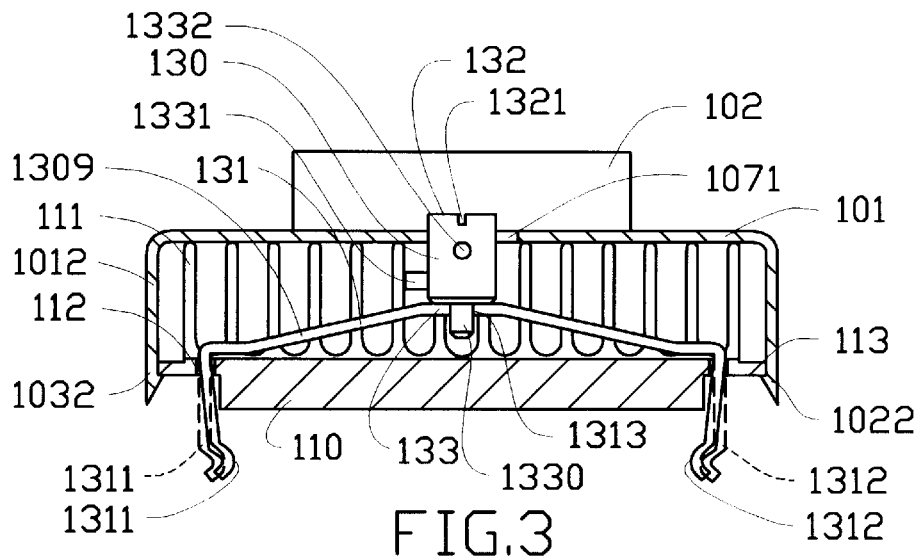
FIG. 3 is a cross-sectional view showing a first state of assembly of the cooling device wherein retention legs of the spring plate are deformed from a first position to reach a second position away from each other.
Figure 4:
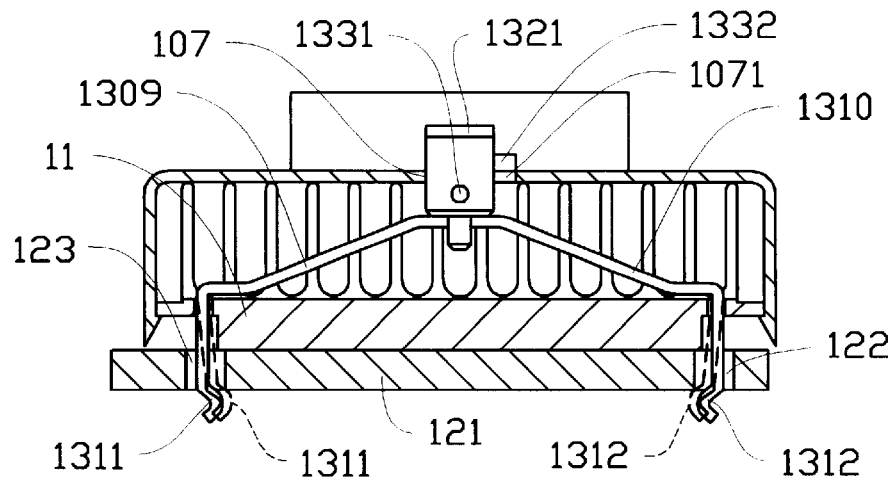
FIG. 4 is a cross-sectional view showing the assembly of the cooling device from the first state to a second state connecting with a CPU attachment plate wherein the retention legs of the spring plate return to their first position to engage with the attachment plate.
Figure 5:
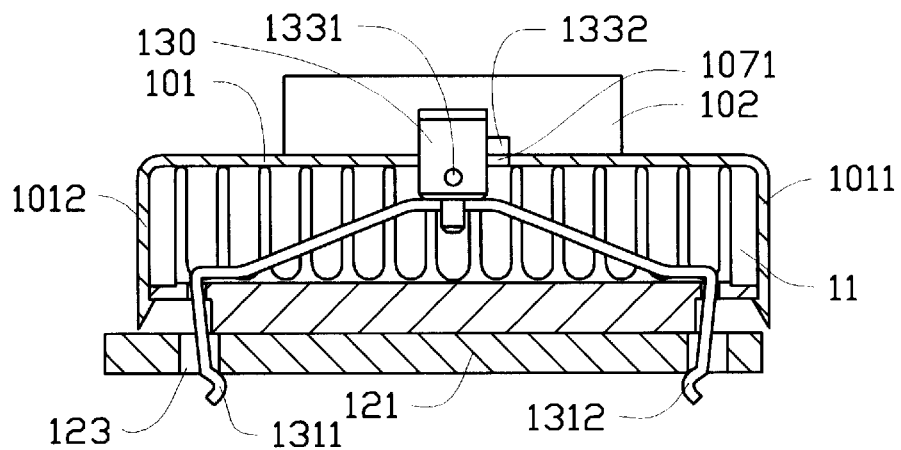
FIG. 5 is a cross-sectional view showing the assembled cooling device in accordance with the present invention.

To assemble the cooling device 1 to the CPU module 12, also referring to FIGS. 3 to 5, the mounting rods 130 are firstly assembled to the fan mounting plate 101 by firstly extending the mounting rods 130 into the holes 107 with an orientation whereby the first positioning keys 1331 pass through the keyways 1071. The rods 130 are then rotated 90 degrees to enable the second positioning keys 1332 to also pass through the keyways 1071. Thereafter, the rods 130 are further rotated 90 degrees to reach a position as shown in FIG. 3. Afterwards, the spring plates 131 are assembled to the mounting rods 130 by extending the studs 1330 through the holes 1313 defined in the rectangular body portions 133. Then, the fan mounting plate 101, the mounting rods 130 and the spring plates 131 are together assembled to the heat sink 11 by moving the spring plates 131 into the corresponding grooves 114 of the heat sink 11 and the engaging teeth 1022, 1032 of the fan mounting plate 101 engage with the flanges 113 of the base plate 110 of the heat sink 11 during which the spring arms 1309, 1310 extend along the base plate 110 away from each other to reach a position in which the retention legs 1311, 1312 extend through the holes 112 in the base plate 110 and are deformed away from their first position relative to the spring arms 1309, 1310 (as shown by solid lines in FIG. 3) to reach a second position (as shown by phantom lines in FIG. 3). At the second position, the retention legs 1311, 1312 are spaced from each other a larger distance than that of the first position. At the state shown in FIG. 3, the spring plates 131 are compressed by the mounting rods 130 and the heat sink 11 to push the second positioning keys 1332 against an inner side of the fan mounting plate 101.

Thereafter, the attachment plate 101 is assembled to the heat sink 11 by extending the two retention legs 1311, 1312 through the corresponding holes 123, 122 in the attachment plate 121 wherein the attachment plate 121 is in contact with the heat sink 11 (FIG. 4). Thereafter, the mounting rods 130 are rotated 90 degrees to cause the second positioning keys 1332 to escape from their engagement with the fan mounting plate 101 by passing through the keyways 1071. Meanwhile, the spring plates 131 push the mounting rods 130 whereby the first positioning keys 1331 abut against the fan mounting plate 101, as shown in FIG. 4. When the spring plates 131 are moved from the state shown in FIG. 3 to that of FIG. 4, the compression force exerted on the spring plates 131 by the mounting rods 130 and the heat sink 11 is reduced whereby the retention legs 1311, 1312 move from the second position as shown by solid lines in FIG. 4 back to the first position as shown by phantom lines in FIG. 4 to cause the bent retention ends (not labeled) of the retention legs 1311, 1312 to engage with the attachment plate 121 whereby the cooling device 1 in accordance with the present invention is assembled as shown in FIG. 5.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

We claim:

1. A cooling device for a CPU, comprising;
    a metallic attachment plate for attachment to a CPU;
    a metallic heat sink in contact with the attachment plate;
    a fan mounting plate fixed to the heat sink;
    a mounting rod mounted on the mounting plate; and
    a spring plate compressed between the mounting rod and the heat sink, said spring plate comprising two retention legs extending through the heat sink and the attachment plate;
    wherein the mounting rod and the spring plate are operable to move between first and second positions by moving the mounting rod, the retention legs engaging with the attachment plate at the first position, and the retention legs disengaging from the attachment plate at the second position.

2. The cooling device in accordance with claim 1, wherein the heat sink has a base plate in contact with the attachment plate and a number of fins projecting from the base plate toward the mounting plate, and wherein the mounting plate has engaging teeth and is fixed to the heat sink by engaging the engaging teeth with the base plate of the heat sink.

3. The cooling device in accordance with claim 2, wherein the fan mounting plate is formed with a generally U-shaped configuration with two parallel walls, and wherein the engaging teeth are formed at free ends of the parallel walls.

4. The cooling device in accordance with claim 1, wherein at the first position, the retention legs are spaced from each other a shorter distance than when the spring plate is at the second position.

5. The cooling device in accordance with claim 1, wherein the mounting rod is formed with a head end for receiving a rotating force, a tail end engaging with the spring plate, a first key protruding from a perimeter of the mounting rod near the tail end and a second key protruding from the perimeter of the mounting rod near the head end, the first key and the second key being oriented in different directions, and wherein the second key engages with the mounting plate at the first position and the first key engages with the mounting plate at the second position.

6. The cooling device in accordance with claim 5, wherein the head end of the mounting rod defining a slot for engaging with a screw driver.

7. The cooling device in accordance with claim 5, wherein the fan mounting plate defines a hole and a keyway in communication with the hole, and the mounting rod is extended through the hole.

8. The cooling device in accordance with claim 1 further comprising an electrical fan mounted to the fan mounting plate.

9. A method for forming a cooling device for a CPU, comprising the following steps:
    preparing a fan mounting plate;

preparing a mounting rod and extending the mounting rod through the fan mounting plate;

preparing a spring plate defining two retention legs and mounting the spring plate to the mounting rod;

preparing a heat sink and fastening the heat sink to the fan mounting plate to cause the spring plate to be compressed between the mounting rod and the heat sink, pushing the mounting rod against the fan mounting plate to reach a first position, and extending the retention legs through the heat sink;

preparing an attachment plate for contacting with a CPU and bringing the attachment plate into contact with the heat sink to reach a position wherein the retention legs extend through the attachment plate; and moving the mounting rod to cause the spring plate to push the mounting rod toward and against the fan mounting plate at a second position wherein the retention legs move toward each other to engage with the attachment plate.

10. The method in accordance with claim 9, wherein the mounting rod has a head end for receiving a rotating force, a tail end rotatably engaging with the spring plate and first and second positioning keys protruding from a perimeter of the mounting rod with different projecting orientations, and wherein the second positioning key engages with the fan mounting plate at the first position, and the first positioning key engages with the fan mounting plate at the second position.

11. The method in accordance with claim 10 wherein the fan mounting plate is formed with a hole and a keyway communicating with the hole, and wherein the mounting rod is extended through the hole.

12. The method in accordance with claim 10, wherein the first and second positioning keys are oriented to be perpendicular to each other.

13. A cooling device for a CPU, comprising:

a metallic attachment plate for attachment to a CPU;

a metallic heat sink in contact with the attachment plate;

a mounting rod;

a spring plate comprising retention means for releasably fastening the attachment plate to the heat sink; and urging means for urging the mounting rod to compress the spring plate between the mounting rod and the heat sink;

wherein the mounting rod and the spring plate are operable to move between first and second positions by rotating the mounting rod, the retention means engaging with the attachment plate at the first position, and the retention means disengaging from the attachment plate at the second position.

14. The cooling device in accordance with claim 13 further comprising an electrical fan mounted to the urging means.

15. The cooling device in accordance with claim 13, wherein the urging means fixedly connects with the heat sink.

16. A cooling system for use with a CPU comprising:

a metallic attachment plate for attachment to CPU;

a metallic heat sink being in contact with the attachment plate;

a spring cooperating with the attachment plate and the heat sink and comprising retention means for releasably fastening the attachment plate to the heat sink; and an actuation device cooperating with the spring wherein the retention means of the spring is engaged with the attachment plate when the actuation device is in a first position and the retention means of the spring is disengaged from the attachment plate when the actuation device is in a second position, whereby the heat sink can be easily attached to or detached from the attachment plate by said actuation device.

17. The cooling device in accordance with claim 16, wherein said actuation device is a mounting rod with a first positioning key and a second positioning key for determining said first and second positions of the mounting rod.

* * * * *